(12) United States Patent
Wang

(10) Patent No.: US 11,374,345 B2
(45) Date of Patent: Jun. 28, 2022

(54) ELECTRICAL CONNECTOR WITH RADIATOR

(71) Applicant: Dongguan Luxshare Technologies Co., Ltd, Dongguan (CN)

(72) Inventor: XiaoKai Wang, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 12 days.

(21) Appl. No.: 17/037,237

(22) Filed: Sep. 29, 2020

(65) Prior Publication Data

US 2021/0367370 A1    Nov. 25, 2021

(30) Foreign Application Priority Data

May 25, 2020   (CN) .......................... 202010450067.0

(51) Int. Cl.
| | | |
|---|---|---|
| H01R 13/502 | (2006.01) | |
| H01R 13/00 | (2006.01) | |
| H01R 13/40 | (2006.01) | |
| H01R 13/514 | (2006.01) | |
| H05K 7/20 | (2006.01) | |

(52) U.S. Cl.
CPC ......... *H01R 13/502* (2013.01); *H01R 13/005* (2013.01); *H01R 13/40* (2013.01); *H01R 13/514* (2013.01); *H05K 7/20436* (2013.01)

(58) Field of Classification Search
CPC .... H01R 13/502; H01R 13/005; H01R 13/40; H01R 13/514; H01R 13/6582; H05K 7/20436; H05K 7/20136; H05K 7/20145
See application file for complete search history.

(56) References Cited

U.S. PATENT DOCUMENTS

| | | | | |
|---|---|---|---|---|
| 7,300,300 | B2 * | 11/2007 | Meijer | ............... H01R 13/6275 439/372 |
| 10,575,442 | B2 * | 2/2020 | Bucher | ............... H01R 12/716 |
| 10,886,661 | B2 * | 1/2021 | Liu | .......................... G06F 1/20 |
| 11,064,633 | B2 * | 7/2021 | Wang | ................... H05K 7/2039 |
| 11,143,830 | B2 * | 10/2021 | Luo | ..................... H01R 13/516 |
| 11,215,772 | B2 * | 1/2022 | Duan | ................... H01R 13/641 |
| 2018/0337476 | A1 * | 11/2018 | Guy Ritter | .......... H01R 12/721 |

(Continued)

FOREIGN PATENT DOCUMENTS

| | | |
|---|---|---|
| CN | 2283933 Y | 6/1998 |
| CN | 2752993 Y | 1/2006 |

(Continued)

*Primary Examiner* — Abdullah A Riyami
*Assistant Examiner* — Nader J Alhawamdeh
(74) *Attorney, Agent, or Firm* — Birch, Stewart, Kolasch & Birch, LLP

(57) ABSTRACT

The present disclosure provides an electrical connector comprising a housing and a radiator. The radiator is disposed on the housing, comprising a fluid flowing space, a fluid input port, and a fluid output port. The fluid input port and the fluid output port are communicating with the fluid flowing space. Fluid flows through the fluid input port to the fluid flowing space. The fluid absorbs the thermal energy generated by a mating connector plugged into the electrical connector. The fluid absorbing the thermal energy generated by the mating connector flows through the fluid output port to external.

15 Claims, 7 Drawing Sheets

(56) References Cited

U.S. PATENT DOCUMENTS

| | | | |
|---|---|---|---|
| 2019/0116692 A1* | 4/2019 | Little | H05K 7/20418 |
| 2019/0288448 A1* | 9/2019 | Liu | H01R 13/6271 |
| 2019/0288459 A1* | 9/2019 | Jin | H01R 13/426 |
| 2019/0387644 A1* | 12/2019 | Liu | H01R 13/502 |
| 2020/0128683 A1* | 4/2020 | Heller | G11B 33/08 |
| 2020/0153163 A1* | 5/2020 | Guetig | H01R 13/6582 |
| 2021/0013679 A1* | 1/2021 | Chen | H01R 13/6581 |
| 2021/0083435 A1* | 3/2021 | Kumar | H01R 13/502 |
| 2021/0104837 A1* | 4/2021 | Wang | H05K 7/2039 |

FOREIGN PATENT DOCUMENTS

| | | | | |
|---|---|---|---|---|
| CN | 105611809 A | * | 5/2016 | |
| CN | 206042653 U | | 3/2017 | |
| CN | 108028494 A | * | 5/2018 | G02B 6/4268 |
| CN | 108987966 A | | 12/2018 | |
| CN | 210468224 U | | 5/2020 | |
| EP | 2818819 A2 | | 12/2014 | |
| KR | 10-0937630 B1 | | 1/2010 | |
| TW | 201223003 A1 | | 6/2012 | |

\* cited by examiner

ELECTRICAL CONNECTOR WITH RADIATOR

CROSS REFERENCE TO RELATED APPLICATION

This application claims the priority benefit of Chinese Patent Application Serial Number 202010450067.0, filed on May 25, 2020, the full disclosure of which is incorporated herein by reference.

BACKGROUND

Technical Field

The present disclosure relates to the technical field of connector, particularly to an electrical connector.

Related Art

Conventional electrical connectors are provided with an air-cooling system. The air-cooling system could bring the thermal energy generated by the mating connector to the external through the flowing air when the electrical connector is connected to the mating connector, avoiding the heat generated by the mating connector from accumulating therein affecting the operation of the connector. In an air-cooling system is basically a fan working with a finned radiator, on which the heat is blown away by the fan for heat dissipation. The greater the windblown by the fan, the louder the noise would be produced, although the overall heat dissipation effect is improved. When the finned radiator is installed in the housing, the overall cooling effect would be greatly reduced since the wind from the fan is difficult to enter the housing.

SUMMARY

The embodiments of the present disclosure provide an electrical connector tended to solve the problem of the loud noise or poor heat dissipating of the air-cooling system of conventional electrical connectors.

The present disclosure provides an electrical connector, comprising a housing and a radiator. The radiator is disposed on the housing, comprising a fluid flowing space, a fluid input port, and a fluid output port. The fluid input port and the fluid output port are communicating with the fluid flowing space. Fluid flows through the fluid input port to the fluid flowing space. The fluid absorbs the thermal energy generated by a mating connector plugged into the electrical connector. The fluid absorbing the thermal energy generated by the mating connector flows through the fluid output port to the external.

In the embodiments of the present disclosure, the heat generated by the mating connector plugged into the electrical connector can be conducted to the external through a fluid without any fans to avoid noises from the fan. Meanwhile, by disposing a radiator using fluid for cooling in the housing of the electrical connector, the heat generated by the mating connector can be normally conducted to the external for excellent heat dissipation.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
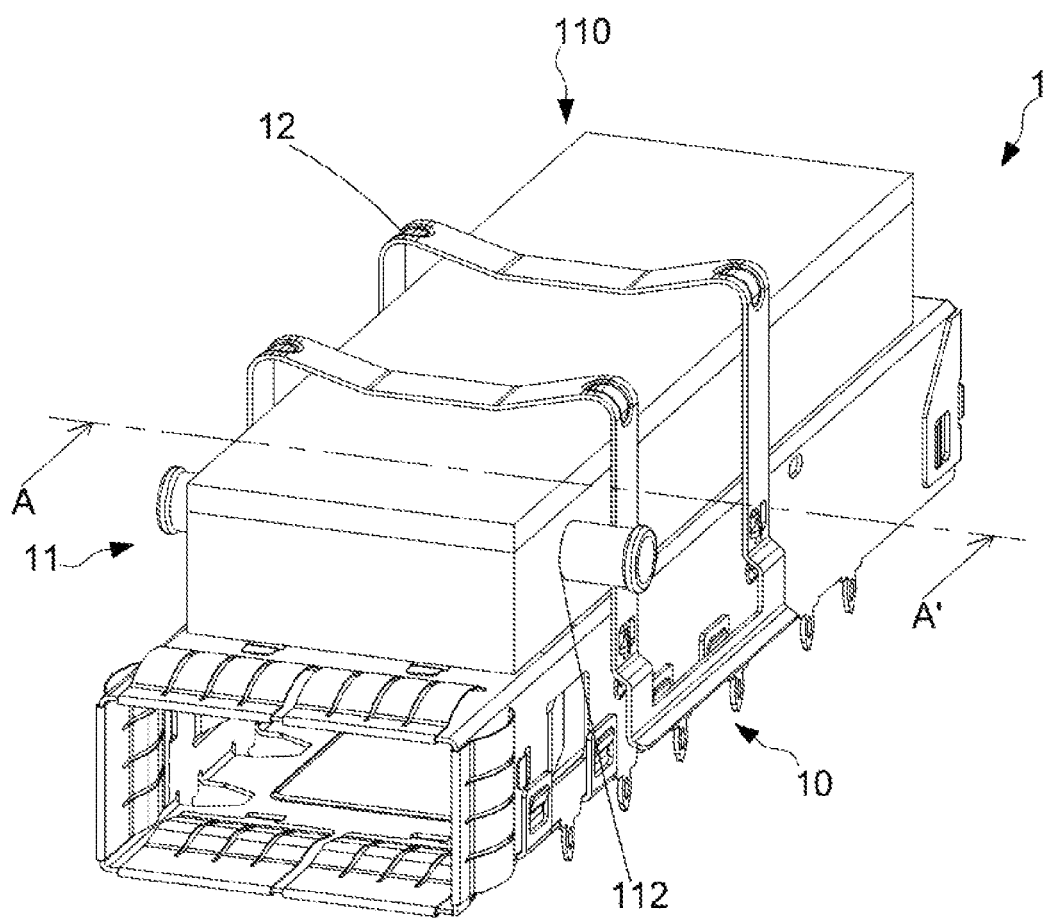
FIG. 1 is a perspective view of an electrical connector of the first embodiment of the present disclosure.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the following embodiment, the same reference numerals are used to refer to the same or similar elements throughout the disclosure.

Figure 2:
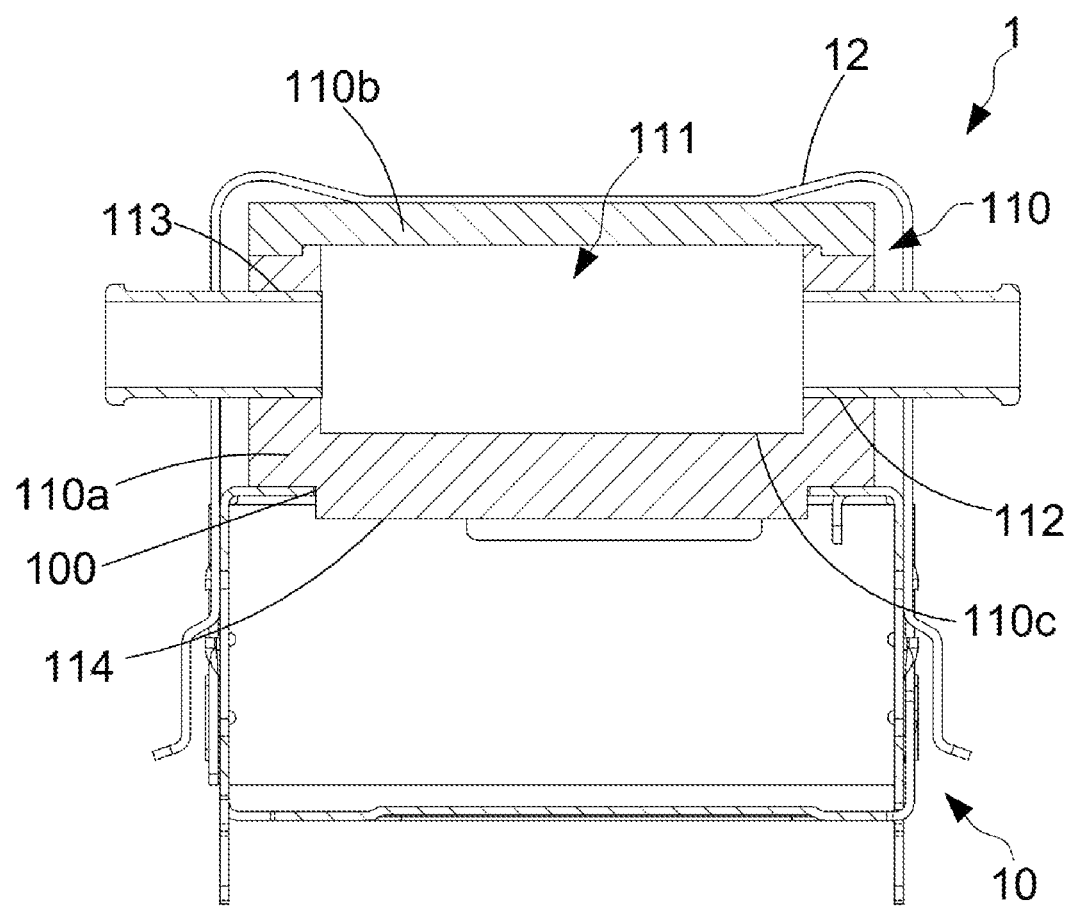
FIG. 2 is a cross-sectional view along line A-A' in FIG. 1.

FIG. 1 is a perspective view of an electrical connector of the first embodiment of the present disclosure. FIG. 2 is a cross-sectional view along line A-A' in FIG. 1. As shown in the figure, the electrical connector 1 of this embodiment comprises a housing 10 and a radiator 11. The housing 10 accommodates the electrical connector body (not shown), and the radiator 11 is disposed on the housing 10. In this embodiment, the radiator 11 is disposed on an outer surface of the housing 10. The radiator 11 of this embodiment absorbs the heat generated by the mating connector (not shown) inserted into the electrical connector 1 by the flowing fluid to perform heat exchange, quickly transferring the heat generated by the mating connector to the external atmosphere. The radiator 11 has a fluid flowing space 111 into which a fluid is provided from the external, filling the fluid flowing space 111. The fluid in the fluid flowing space 111 absorbs the heat generated by the mating connector for heat exchange. The fluid that absorbs the thermal energy generated by the mating connector flows out from the fluid flowing space 111 to quickly conduct the thermal energy generated by the electrical connector 1 to the external, effectively improving the overall heat dissipation.

In this embodiment, the radiator 11 has a radiator body 110 disposed on an outer surface of the housing 10. The radiator body 110 is made of high thermal conductivity materials. The inner part radiator body 110 is provided with a fluid flowing space 111, and a fluid input port 112 and a fluid output port 113. The fluid input port 112 and the fluid output port 113 are in communication with the fluid flowing space 111, which indicates that the radiator body 110 is provided with no other fluid output ports except the fluid input port 112 and the fluid output port 113 connected to the fluid flowing space 111. Under the condition that the fluid input port 112 and the fluid output port 113 are respectively connected to the outer part through pipelines, the fluid flowing space 111 is in a closed state.

When the electrical connector 1 of this embodiment is in use, a mating connector (not shown) is plugged into the electrical connector 1. In this embodiment, the electrical connector 1 is a socket, and the mating connector is a plug. The heat generated by the mating connector is conducted to the radiator body 110 of the radiator 11, and the fluid input port 112 is connected to an external fluid supplying device through a pipeline. The fluid supplying device supplies fluid into the fluid flowing space 111 through the fluid input port 112, and the fluid flowing in the fluid flowing space 111 absorbs and conducts the thermal energy of the radiator body 110. As the fluid supplying device continues to input fluid into the fluid flowing space 111 through the fluid input port 112, the fluid absorbing the thermal energy is pushed in the fluid flow space 111 toward the fluid output port 113 and is outputted from the fluid output port 113. The fluid output port 113 is connected to an external fluid discharge device through a pipeline. So, the fluid that has absorbed thermal energy could flow from the pipeline to the fluid discharge device, ensuring that the fluid that has absorbed heat energy would not remain at the outer part of the electrical connector 1. In one embodiment, the fluid discharge device has an extraction pump. Since the fluid discharge device could extract the fluid from the fluid flowing space 111 through the pipeline, the flowing speed of the fluid in fluid flowing space 111 can be increased, and the overall heat dissipation effect can be effectively improved. The fluid described above can be high thermal conductivity liquid or high thermal conductivity gas.

The radiator body 110 of this embodiment has a base 110a and a cover 110b. The base 110a has a fluid flowing groove 110c. The cover 110b is disposed on the base 110a and seals the fluid flowing groove 110c. The space in the fluid flowing groove 110c is the fluid flowing space 111. The fluid input port 112 and the fluid output port 113 are disposed on a sidewall of the fluid flowing groove 110c of the base 110a to communicate with the fluid flowing space 111. The fluid input port 112 and the fluid output port 113 of this embodiment are oppositely disposed on two sides of the base 110a. That is, the fluid input port 112 and the fluid output port 113 are disposed on opposite sides of the radiator body 110. The orientation of the radiator body 110 described above is only an embodiment of the present disclosure, which should not be limited thereto.

In one embodiment, the radiator 11 further comprises a heat conducting block 114 disposed on one side of the radiator body 110. The housing 10 has an opening 100. When the radiator 11 is disposed on the housing 10, the radiator body 110 is disposed on an outer surface of the housing 10, and the heat conducting block 114 is disposed in the opening 100 and extends into the housing 10. When the mating connector is plugged into the electrical connector 1, the heat conducting block 114 can be in contacting with the mating connector. Thus, the heat conducting block 114 can quickly conduct heat energy to the radiator body 110. The radiator body 110 performs heat dissipation by absorbing the heat energy through the flowing fluid, which effectively improves the overall heat dissipation.

In one embodiment, the electrical connector 1 further comprises a securing member 12 securing the radiator 11 onto the housing 10. The securing member 12 spans across the radiator 11 and the two ends of the securing member 12 are secured to opposite sides of the housing 10 to limit the radiator 11 onto an outer surface of the housing 10. When the mating connector is inserted into the electrical connector 1, the mating connector drives the heat conducting block 114 to move away from the housing 10. So, the radiator 11 moves in a direction away from the housing 10. In this embodiment, the entire radiator 11 is driven upward, allowing the mating connector to be inserted without obstruction. The securing member 12 applies a force downward on the radiator 11 so that the radiator 11 can be clamped by the securing member 12 and the mating connector. Thus, the heat conducting block 114 of the radiator 11 can be continuously in contact with the mating connector, and can also limit the radiator 11 on the housing 10.

Figure 3:
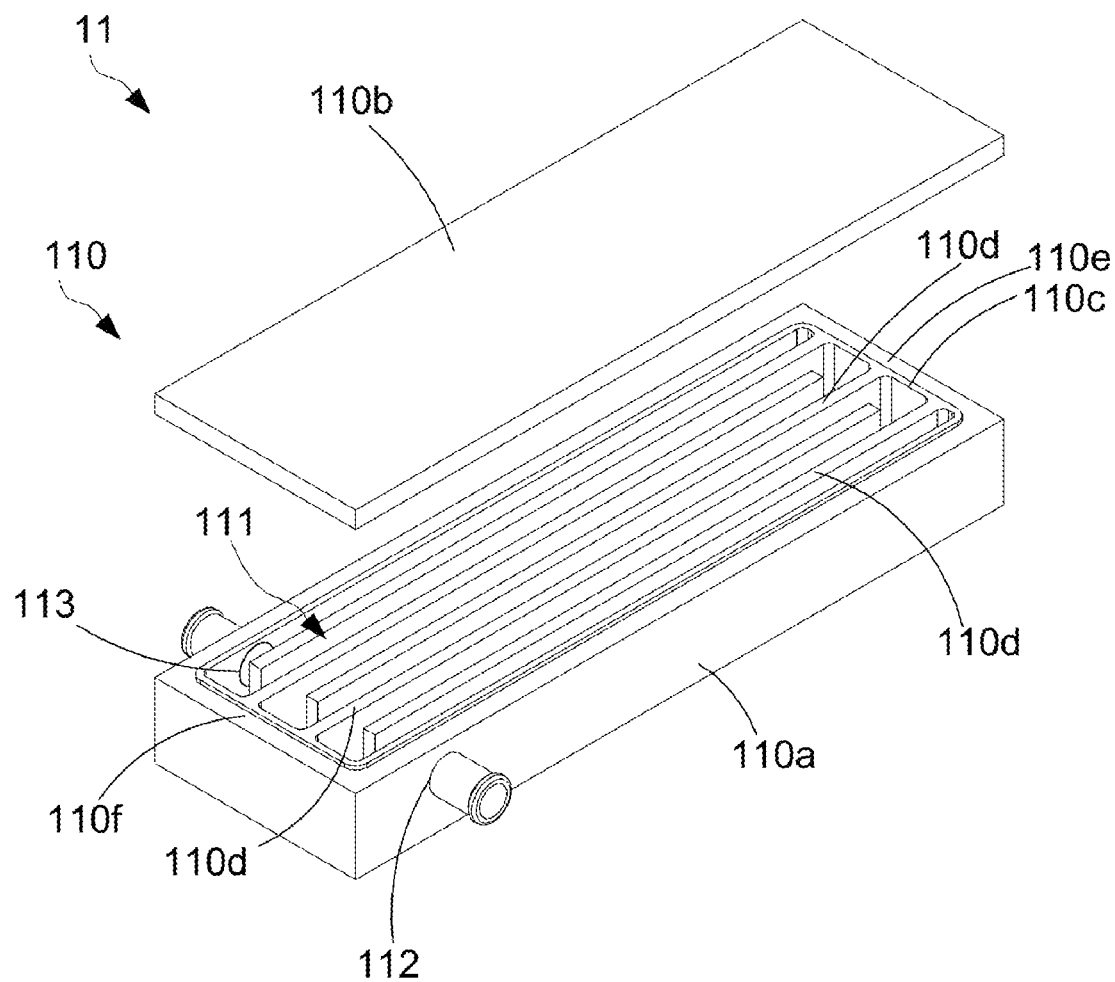
FIG. 3 is an exploded view of a radiator of the second embodiment of the present disclosure.

FIG. 3 is an exploded view of a radiator of the second embodiment of the present disclosure. As shown in the figure, another type of radiator 11 is provided in this embodiment, replacing the radiator of the electrical connector of the first embodiment. The fluid flowing space 111 of the radiator 11 in this embodiment is a maze type fluid flowing space 111. The fluid input port 112 and the fluid output port 113 are respectively disposed at two ends of the maze type fluid flowing space 111. In this way, the fluid imported from the fluid input port 112 flows in the maze type fluid flowing space 111. The maze type fluid flowing space 111 guides the flowing direction of the fluid, which increases the length of the fluid flowing path and ensures that the fluid could effectively absorb the heat generated by the mating connector. Thus, the heat dissipation efficiency of the radiator 11 can be effectively improved.

The radiator body 110 of this embodiment also has a plurality of deflectors 110d disposed in the fluid flowing groove 110c of the base 110a to form a maze type fluid flowing space 111. In one embodiment, the fluid flowing groove 110c has a first sidewall 110e and a second sidewall 110f opposite to the first sidewall 110e. The plurality of deflectors 110d are disposed in the fluid flowing groove 110c at intervals. One end of each of the deflectors 110d is connected to the first sidewall 110e or the second sidewall 110f. One end of each of the deflectors 110d extends into the fluid flowing groove 110c. The plurality of deflectors 110d connected to the first sidewall 110e and the plurality of deflectors 110d connected to the second sidewall 110f are alternately disposed in parallel. The other end of the deflector 110d connected to the first sidewall 110e is disposed between two adjacent deflectors 110d connected to the second sidewall 110f. That is, the deflectors 110d connected to the first sidewall 110e are partially overlapped with the deflectors 110d connected to the second sidewall 110f. In another words, the other end of the deflector 110d connected to the first sidewall 110e is not connected to the second sidewall 110f, and a gap exists between the deflector 110d connected to the first sidewall 110e and the second sidewall 110f. Similarly, the other end of the deflector 110d connected to the second sidewall 110f is not connected to the first sidewall 110e, and a gap exists between the deflector 110d connected to the second sidewall 110f and the first sidewall 110e. Thus, a maze type fluid flowing space 111 can be formed.

Figure 4:
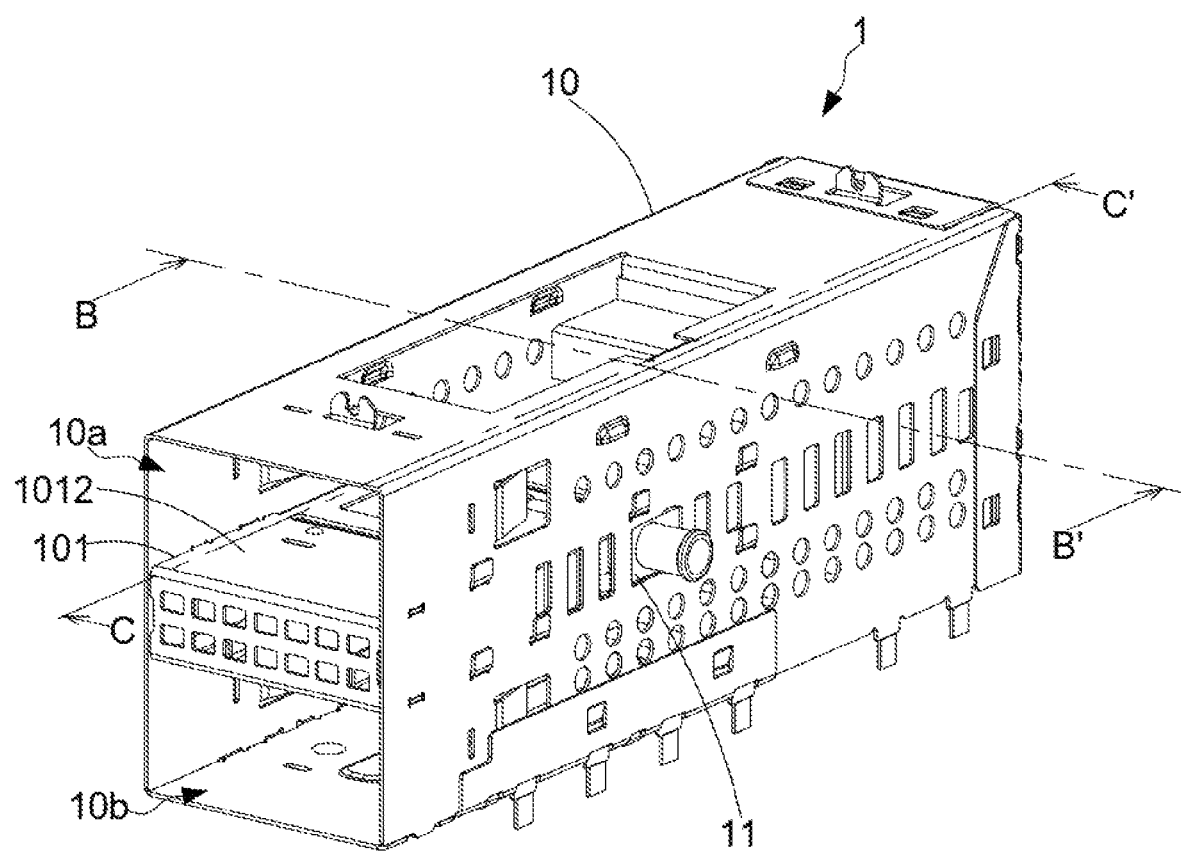
FIG. 4 is a perspective view of an electrical connector of the third embodiment of the present disclosure.
Figure 5:
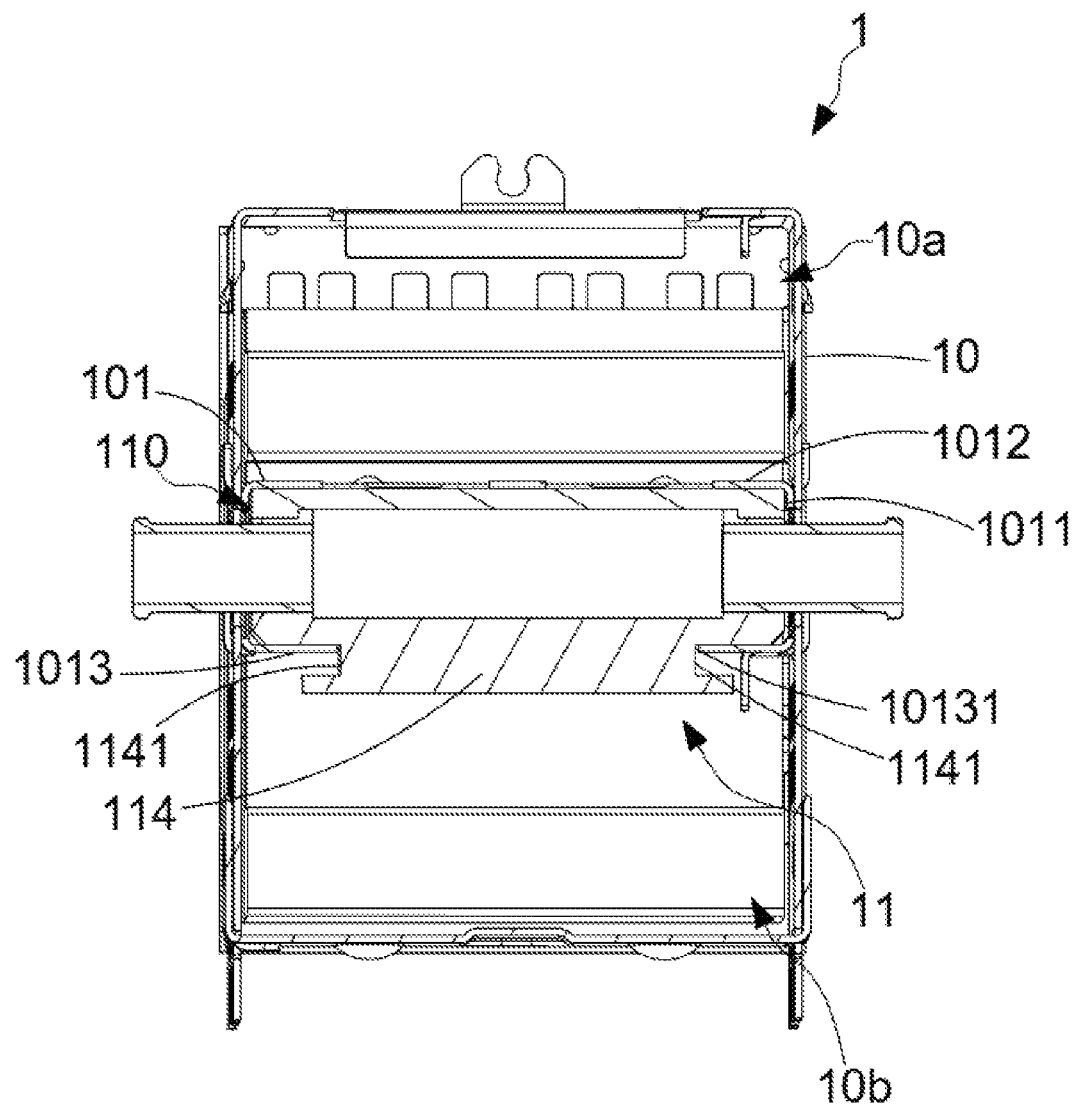
FIG. 5 is a cross-sectional view along line B-B' in FIG. 4.

FIG. 4 is a perspective view of an electrical connector of the third embodiment of the present disclosure. FIG. 5 is a cross-sectional view along line B-B' in FIG. 4. As shown in the figure, the electrical connector 1 of this embodiment is different from the first embodiment in that the radiator 11 of this embodiment is disposed in the housing 10. The housing 10 of this embodiment has a partition member 101. The space in the housing 10 is divided into two parts by the partition member 101. So, the housing 10 is able to accommodate two electrical connector bodies, i.e., the two electrical connector bodies are disposed on two sides of the partition member 101. The radiator 11 of this embodiment is installed to the partition member 101, which divides the inner space of the housing 10 into a first space 10a and a second space 10b. The first space 10a and the second space 10b could respectively accommodate an electrical connector body. The radiator 11 can simultaneously dissipate the heat of the two mating connectors inserted into the two electrical connector bodies disposed in the first space 10a and the second space 10b. The fluid input port 112 and the fluid output port 113 of the radiator 11 of this embodiment are exposed from the housing 10 to facilitate the connection between the external fluid supplying device and the fluid input port 112 and the discharge of the fluid that absorbs thermal energy from the fluid output port 113 to the external area.

The partition member 101 of this embodiment has an accommodating groove 1011 comprising a first accommodating sidewall 1012 and a second accommodating sidewall 1013 opposite to the first accommodating sidewall 1012. The second accommodating side wall 1013 has an accommodating opening 10131. The first accommodating side wall 1012 is disposed in the first space 10a, and the second accommodating sidewall 1013 is disposed in the second space 10b. When the radiator 11 is disposed in the accommodating groove 1011 of the partition member 101, the radiator body 110 is disposed in the accommodating groove 1011. The heat conducting block 114 protrudes from the accommodating opening 10131 of the second accommodating sidewall 1013 and is disposed in the second space 10b. The heat conducting block 114 is able to contact and conduct the heat generated by the mating connector of the electrical connector body inserted in the second space 10b. The heat conducting block 114 can quickly conduct the heat generated by the mating connector to the radiator body 110. Thus, the heat dissipation for the mating connector inserted in the second space 10b performed by the radiator 11 is greatly improved.

The accommodating opening 10131 can also be disposed on the first accommodating sidewall 1012. The heat conducting block 114 protrudes from the first accommodating sidewall 1012 and enters the first space 10a. The heat conducting block 114 could rapidly conduct the thermal energy of the mating connector of the electrical connector body inserted in the first space 10a to the external. Alternatively, an accommodating opening 10131 can be provided on the first accommodating sidewall 1012 and the second accommodating sidewall 1013 respectively. The radiator body 110 of the radiator 11 is provided with two heat conducting blocks 114 on its two opposite surfaces respectively. One heat conducting block 114 protrudes form the first accommodating sidewall 1012 and enters the first space 10a, while the other heat conducting block 114 protrudes form the second accommodating sidewall 1013 and enters the second space 10b. The two heat conducting blocks 114 simultaneously and rapidly conduct thermal energy from the mating connector of the electrical connector body inserted in the first space 10a and from the mating connector of the electrical connector body inserted in the second space 10b to the external.

Figure 6:
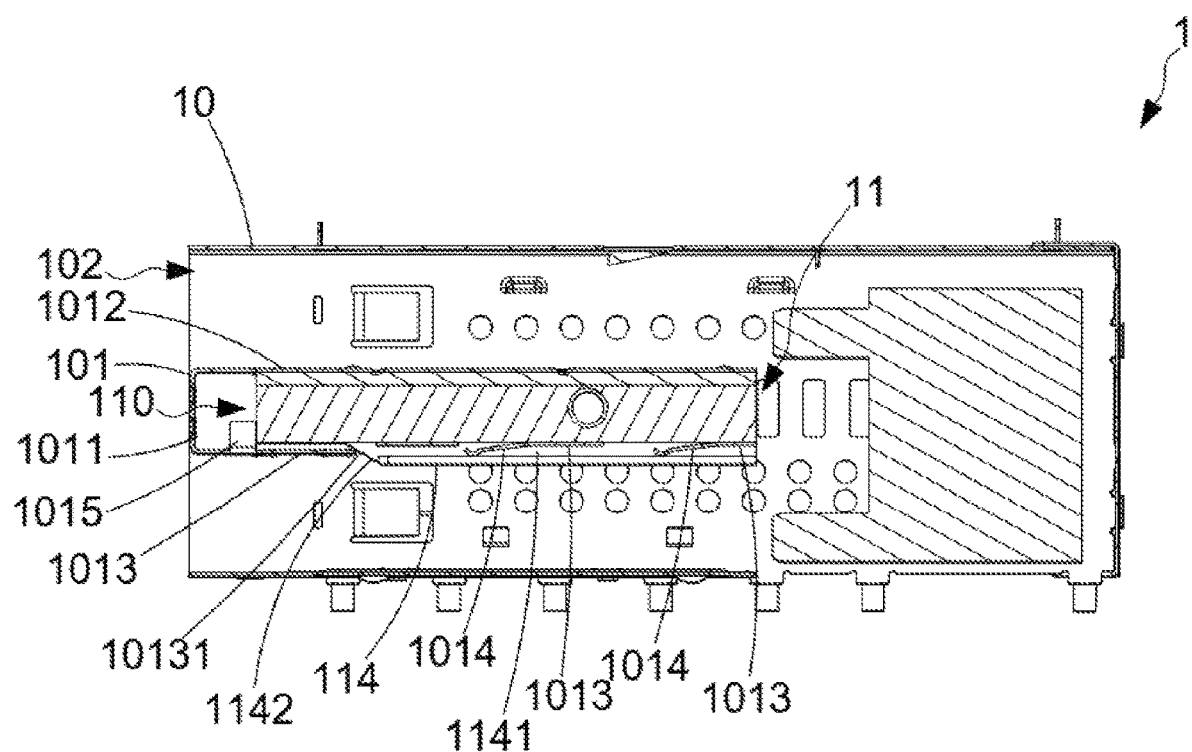
FIG. 6 is a cross-sectional view along line C-C' in FIG. 4.

In one embodiment, on two sides of the heat conducting block 114 are respectively provided with sliding grooves 1141. When the radiator 11 is disposed on the partition member 101, the two opposite side edges of the accommodating opening 10131 respectively enter the corresponding sliding grooves 1141 to locate the position of the radiator 11 on the partition member 101. In one embodiment, as shown in FIG. 6, a cross-sectional view along line C-C' in FIG. 4, the partition member 101 has a plurality of supporting elastic sheets 1014. One ends of the plurality of supporting elastic sheets 1014 are disposed on the second accommodating sidewall 1013, and is disposed on two opposite sides of the accommodating opening 10131. The plurality of supporting elastic sheets 1014 extends in a direction away from the accommodating groove 1011. When the radiator 11 is disposed on the partition member 101, the plurality of the supporting elastic sheets 1014 abuts against a surface of the sliding groove 1141 away from the second accommodating sidewall 1013. When the mating connector is inserted into the electrical connector body of the second space 10b, the mating connector drives the heat conducting block 114 to move in a direction closing to the first space 10a (upward), which also drives the radiator 11 to move in a direction closing to the first space 10a, allowing the mating connector to be plugged into the electrical connector body of the second space 10b without obstruction. In addition, the plurality of supporting elastic sheets 1014 applies a force (downward) on the heat conducting block 114 toward the second space 10b, keeping the heat conducting block 114 be in contact with the mating connector.

In one embodiment, the housing 10 comprises a plug interface 102. One end of the heat conducting block 114 is provided with a limiting inclined surface 1142 disposed between two opposite sides of the heat conducting block 114. When the radiator 11 is disposed on the partition member 101, one end of the heat conducting block 114 having the limiting inclined surface 1142 first enters the accommodating opening 10131. Then, the limiting inclined surface 1142 is in contact with a side edge of the accommodating opening 10131 close to the plug interface 102, and the radiator 11 stops moving toward one end of the accommodating groove 1011 close to the plug interface 102.

In one embodiment, the partition member 101 further comprises a positioning bump 1015. The positioning bump 1015 is disposed in the accommodating groove 1011 and is disposed on one end of the accommodating groove 1011 close to the plug interface 102. In this embodiment, the positioning bump 1015 is disposed on the second accommodating sidewall 1013 and extends to the first accommodating sidewall 1012. When the radiator 11 is disposed in the partition member 101, one end of the radiator body 110 close to the plug interface 102 abuts against the positioning bump 1015. The positioning bump 1015 can prevent the radiator 11 from continuously moving toward one end of the accommodating groove 1011 close the plug interface 102. The radiator 11 of this embodiment can be replaced with the that of the second embodiment, which would not be repeated herein.

Figure 7:
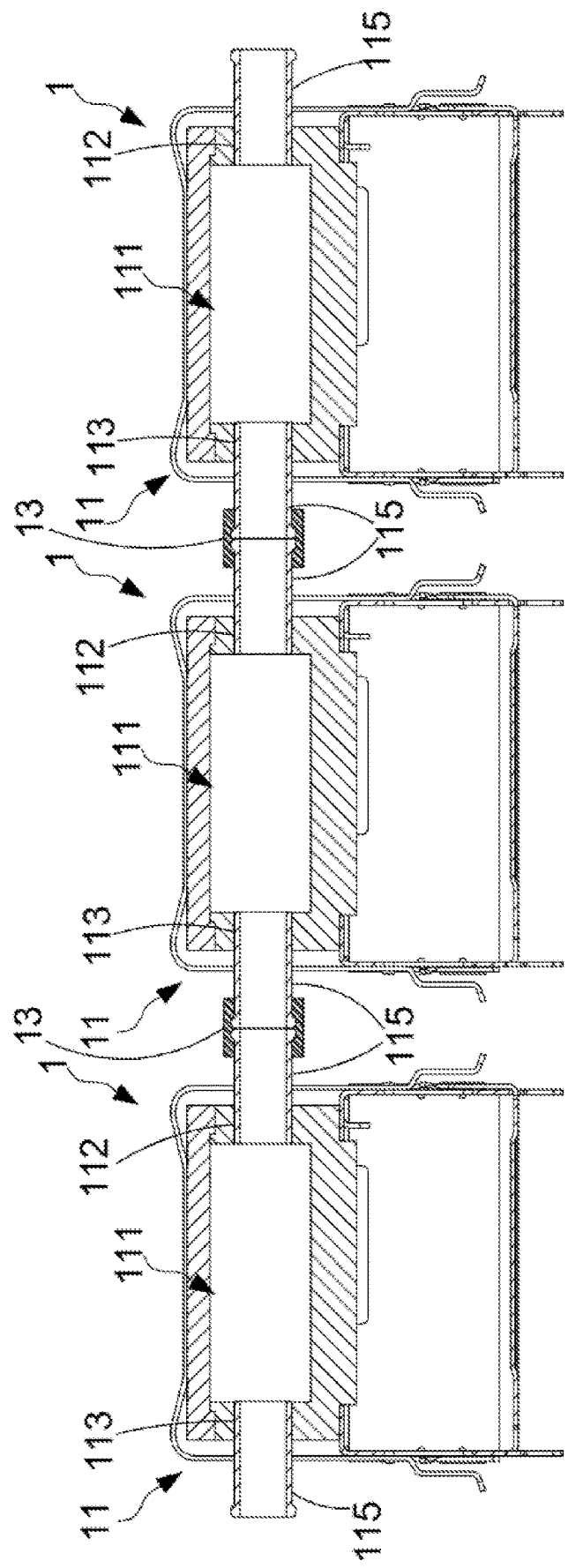
FIG. 7 is a combined cross-sectional view of an electrical connector of the fourth embodiment of the present disclosure.

FIG. 7 is a combined cross-sectional view of an electrical connector of the fourth embodiment of the present disclosure. As shown in the figure, in this embodiment, a plurality of electrical connectors 1 of the first embodiment are connected in series. The radiator 11 of each electrical connector 1 of this embodiment has a fluid input port 112 and a fluid output port 113 opposite to the fluid input port 112. The fluid input port 112 of the radiator 11 of each electrical connector 1 is connected to the adjacent fluid output port 113 of the radiator 11 of the adjacent electrical connector 1. When a plurality of electrical connectors 1 are connected in series, the fluid is input into the fluid input port 112 of the radiator 11 of the electrical connector 1 on the far right. The fluid passes through the fluid flowing space 111 of the radiator 11 of each electrical connector 1 in order and is finally outputted from the fluid output port 113 of the radiator 11 of electrical connector 1 on the far left.

In one embodiment, the fluid input port 112 and the fluid output port 113 are provided with a connecting tube 115. The connecting tube 115 of the fluid input port 112 of the radiator 11 of each electrical connector 1 is connected to the adjacent connecting tube 115 of the fluid output port 113 of the radiator 11 of the adjacent electrical connector 1. The connecting tube 115 of the fluid input port 112 can be connected to the connecting tube 115 of the fluid output port 113 through a connecting member 13 or a quick coupler. The plurality of electrical connectors 1 of the third embodiment can also be connected in series, of which the connecting is identical to the series connection of this embodiment. Thus, this would not be described herein.

In summary, embodiments of the present disclosure provide an electrical connector. The heat generated by the mating connector plugged into the electrical connector can be conducted to the external through a fluid without any fans to avoid noises from the fan. Meanwhile, by disposing a radiator using fluid for cooling in the housing of the electrical connector, the heat generated by the mating connector can be normally conducted to the external for excellent heat dissipation.

It is to be understood that the term "comprises", "comprising", or any other variants thereof, is intended to encompass a non-exclusive inclusion, such that a process, method, article, or device of a series of elements not only comprise those elements but also comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. An electrical connector, comprising:
a housing; and
a radiator disposed on the housing, comprising a fluid flowing space, a fluid input port and a fluid output port, the fluid input port and the fluid output port being communicating with the fluid flowing space;
wherein fluid flows through the fluid input port to the fluid flowing space; the fluid absorbs the thermal energy generated by a mating connector plugged into the electrical connector; the fluid absorbing the thermal energy generated by the mating connector flows through the fluid output port to the external, and
wherein the radiator comprises a radiator body comprising a base and a cover; the base comprises a fluid flowing groove; the fluid input port and the fluid output port are respectively disposed on two opposite sidewalls of the fluid flowing groove; the cover is disposed on the base and seals the fluid flowing groove; the space in the fluid flowing groove is the fluid flowing space.

2. The electrical connector according to claim 1, wherein the fluid flowing space is a maze type fluid flowing space.

3. The electrical connector according to claim 2, wherein the radiator body further comprises a plurality of deflectors disposed in the fluid flowing groove.

4. The electrical connector according to claim 3, wherein the fluid flowing groove comprises a first sidewall and a second sidewall opposite to the first sidewall; one end of each of the deflectors is connected to the first sidewall or the second sidewall; the other end of each of the deflectors extends into the fluid flowing groove; the plurality of deflectors connected to the first sidewall and the plurality of deflectors connected to the second sidewall are alternately disposed in parallel; the other end of the deflector connected to the first sidewall is disposed between two adjacent deflectors connected to the second sidewall.

5. The electrical connector according to claim 1, wherein the radiator is disposed on one side of an outer surface of the housing.

6. The electrical connector according to claim 5, wherein the radiator further comprises a heat conducting block disposed on one side of the radiator body; the housing comprises an opening; the heat conducting block is disposed in the opening.

7. The electrical connector according to claim 5 further comprises a securing member crossing the radiator; two ends of the securing member are secured onto opposite two sides of the housing.

8. The electrical connector according to claim 1, wherein the housing comprises a partition member; the radiator is disposed at the partition member; the fluid input port and the fluid output port are exposed from the housing.

9. The electrical connector according to claim 8, wherein the partition member comprises an accommodating groove comprising a first accommodating sidewall and a second accommodating sidewall opposite to the first accommodating sidewall; the radiator is disposed in the accommodating groove.

10. The electrical connector according to claim 9, wherein the radiator further comprises a heat conducting block disposed on one side of the radiator body; the second accommodating sidewall comprises an accommodating opening; the radiator body is disposed in the accommodating groove; the heat conducting block is disposed in the accommodating opening and protrudes from the second accommodating sidewall.

11. The electrical connector according to claim 10, wherein opposite two sides of the heat conducting block are respectively provided with sliding grooves; two opposite sides of the accommodating opening respectively enter the corresponding sliding groove.

12. The electrical connector according to claim 11, wherein the partition member further comprises a plurality of supporting elastic sheets; one end of the plurality of supporting elastic sheets is disposed on the second accommodating sidewall; one end of the plurality of supporting elastic sheets is disposed on two opposite sides of the accommodating opening; the plurality of supporting elastic sheets extends in a direction away from the accommodating groove; the plurality of the supporting elastic sheets abuts against a surface of the sliding groove away from the second accommodating sidewall.

13. The electrical connector according to claim 11, wherein the housing comprises a plug interface; one end of the heat conducting block is provided with a limiting inclined surface; the limiting inclined surface is in contact with a side edge of the accommodating opening close to the plug interface.

14. The electrical connector according to claim 13, wherein the partition member further comprises a positioning bump disposed in the accommodating groove; the positioning bump is disposed on one end of the accommodating groove close to the plug interface; one end of the radiator body close to the plug interface abuts against the positioning bump.

15. The electrical connector according to claim 1, wherein the fluid input port and the fluid output port are respectively provided with connecting tubes.

\* \* \* \* \*